(12) United States Patent
Raman et al.

(10) Patent No.: US 8,222,967 B1
(45) Date of Patent: Jul. 17, 2012

(54) RECEIVER EQUALIZER CIRCUITRY HAVING WIDE DATA RATE AND INPUT COMMON MODE VOLTAGE RANGES

(75) Inventors: Sangeeta Raman, San Jose, CA (US); Tim Tri Hoang, San Jose, CA (US); Sergey Yuryevich Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 332 days.

(21) Appl. No.: 12/644,128

(22) Filed: Dec. 22, 2009

(51) Int. Cl.
*H03H 7/30* (2006.01)
*H03F 3/45* (2006.01)

(52) U.S. Cl. ...................................... 333/28 R; 375/229
(58) Field of Classification Search ................. 333/28 R, 333/18; 375/229, 230, 232, 233
See application file for complete search history.

(56) References Cited

U.S. PATENT DOCUMENTS

| | | | | |
|---|---|---|---|---|
| 7,633,354 B2 * | 12/2009 | Kuijk et al. | .................. | 333/28 R |
| 2006/0001504 A1 * | 1/2006 | Singh et al. | .................. | 333/28 R |
| 2007/0041455 A1 | 2/2007 | Tran et al. | | |

OTHER PUBLICATIONS

Chen, J. et al., "Electrical Backplane Equalization Using Programmable Analog Zeros and Folded Active Inductors," IEEE Transactions on Microwave Theory and Techniques, vol. 55, No. 7, pp. 1459-1466, Jul. 2007.
Bi, H. et al., "A Quad 1-10Gb/s Serial Transceiver in 90nm CMOS," IEEE Asian Solid-State Circuits Conference, Nov. 12-14, 2007.

* cited by examiner

*Primary Examiner* — Stephen Jones
(74) *Attorney, Agent, or Firm* — Ropes & Gray LLP

(57) ABSTRACT

Equalizer circuitry on an integrated circuit ("IC") includes a plurality of NMOS equalizer stages connected in series. Each NMOS stage may include folded active inductor circuitry. Each NMOS stage may also include various circuit elements having controllably variable circuit parameters so that the equalizer can be controllably adapted to perform for any of a wide range of high-speed serial data signal bit rates and other variations of communication protocols and/or communication conditions. For example, each NMOS stage may be programmable to control at least one of bandwidth and power consumption of the equalizer circuitry. The equalizer may also have a first PMOS stage that can be used instead of the first NMOS stage in cases in which the voltage of the incoming signal to be equalized is too low for an initial NMOS stage.

24 Claims, 5 Drawing Sheets

| Controllably Variable Circuit Parameter(s) | Value(s) for 12.5 Gbps | Value(s) for 3.125 or 6.25 Gbps |
|---|---|---|
| I1/I2 | D | 0.5D |
| RLI/RL2 | E | 2.0E |
| RS | F | 2.0F |
| CS | Variable, Depending on Frequency of Operation, Desired Gain, etc. | |
| I3 | G | 0.5G |
FIG. 5
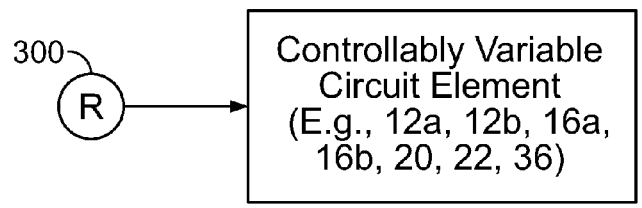
FIG. 6
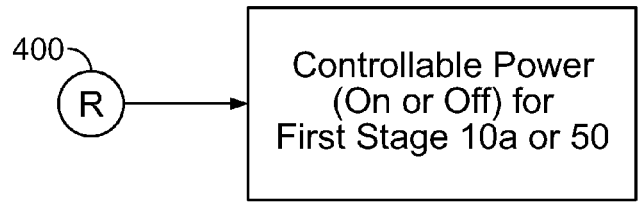
FIG. 7

RECEIVER EQUALIZER CIRCUITRY HAVING WIDE DATA RATE AND INPUT COMMON MODE VOLTAGE RANGES

BACKGROUND

This invention relates to receiver equalizer circuitry, and more particularly to high-speed serial data signal receiver equalizer circuitry for inclusion in an integrated circuit ("IC") device.

Certain kinds of ICs are manufactured and sold as relatively general-purpose devices. The IC manufacturer does not know all of the specific requirements of all of the users who purchase the IC for use in various larger systems being built by those users. To increase the number of users who can use the IC, it is desirable for the manufacturer to give the IC a wide range of capabilities. This helps to increase sales volume of the IC, which can help to lower the IC's unit cost. Examples of such relatively general-purpose ICs are programmable logic devices ("PLDs"), field-programmable gate arrays ("FPGAs"), programmable microcontrollers, and the like.

An area of particular interest in IC and electronic system design is high-speed serial data signalling or communication, e.g., between ICs in a larger system. The speeds (data rates or bit rates) of interest for such communication are constantly increasing, at least for some applications. However, other users of such communication are still interested in using somewhat older or slower high-speed serial communication protocols. Therefore, a general-purpose IC manufacturer who wants to maximize sales volume of a particular IC product needs to provide an IC that can support high-speed serial data communication over a very wide range that includes both current high-end data rates and a useful selection of older and slower data rate protocols. An example of a wide data rate range that it may be desirable for a general-purpose IC to now support is from about 3.125 Gigabits-per-second ("Gbps") to about 12.5 Gbps.

Such a wide range of performance requirements can be particularly difficult to provide in the portion of an IC that must initially receive and correctly interpret the data in a high-speed serial signal that is being applied to the IC from another device in a system. A typical component of such receiver circuitry is so-called equalizer circuitry. Equalizer circuitry is provided to improve the quality of the received signal (e.g., by enhancing inter-bit or inter-symbol transitions in the received signal, opening data "eyes" in the received signal, reducing inter-symbol interference ("ISI") and/or other noise in the received signal, etc.) so that other utilization circuitry (e.g., clock and data recovery ("CDR") circuitry) downstream from the equalizer can more accurately and reliably recover the data information contained in the data signal. Equalizer circuitry able to support a wide range of high-speed serial data rates is particularly challenging to provide.

Different high-speed serial data signalling protocols may differ not only in data rate, but also with respect to other signal parameters. For example, some protocols have a requirement for a DC-coupled mode with very low input common mode voltages. However, other protocols (e.g., with higher data rates) require high input common mode voltages. Again, it is difficult to provide equalizer circuitry that can support both a wide data rate range and a wide common mode voltage range.

SUMMARY

In accordance with certain possible aspects of the invention, equalizer circuitry on an integrated circuit ("IC") may include a plurality of NMOS equalizer stages connected in series, each of the NMOS equalizer stages being programmable to control at least one of bandwidth and power consumption of the equalizer circuitry.

In accordance with certain other possible aspects of the invention, equalizer circuitry on an IC may include a plurality of NMOS equalizer stages connected in series, a PMOS equalizer stage connected in parallel with the NMOS equalizer stage that is first in the series, and control circuitry for determining whether the PMOS equalizer stage or the NMOS equalizer stage that a first in the series will be used.

In accordance with certain still other possible aspects of the invention, equalizer circuitry on an IC may include a plurality of differential NMOS equalizer stages connected in series. Each NMOS equalizer stage may included folded active inductor circuitry. The equalizer circuitry may further include a differential PMOS equalizer stage connected in parallel with the first NMOS stage. The equalizer circuitry may still further include control circuitry for determining (controlling) whether the PMOS equalizer stage or the first NMOS equalizer stage is used.

Further features of the invention, its nature and various advantages will be more apparent from the accompanying drawings and the following detailed description.

BRIEF DESCRIPTION OF THE DRAWINGS

FIG. 5 is a simplified table showing examples of how various circuit element parameters may be variably controlled in accordance with certain possible aspects of the invention.

FIG. 6 is a simplified schematic block diagram showing an illustrative embodiment of additional possible circuitry in accordance with the invention.

FIG. 7 is a simplified schematic block diagram showing an illustrative embodiment of still more possible circuitry in accordance with the invention.

DETAILED DESCRIPTION

As has been mentioned, an equalizer may be used on the receiver end of a high-speed serial data signal link to compensate for the frequency-dependent losses (for example, due to skin-effect and dielectric loss of the transmission media (e.g., backplane circuitry)). If not rectified (remedied), these effects lead to inter-symbol interference ("ISI"), and hence an increase in the bit-error rate ("BER") at the receiver.

In the illustrative embodiments of the present invention that are discussed herein, the equalizer preferably provides a gain boost to the frequency components of the received high-speed serial data signal at half the data rate. This is due to use of the equalizer with a half-rate architecture implementation of the downstream data recovery (e.g., CDR) circuit. For example, FIG. 1 shows a gain curve for equalizer circuitry that may be constructed in accordance with the principles of this invention.

As data rates keep increasing, the equalizer bandwidth also needs to increase proportionally. In other words, the frequency at which the gain curve peaks in FIG. 1 needs to move to the right. But at the same time, lower data rates are still in use, and so a general-purpose IC manufacturer needs to cater to varying requirements, which leads to a need for controllably variable (e.g., programmable/selectable) bandwidth.

Figure 1:
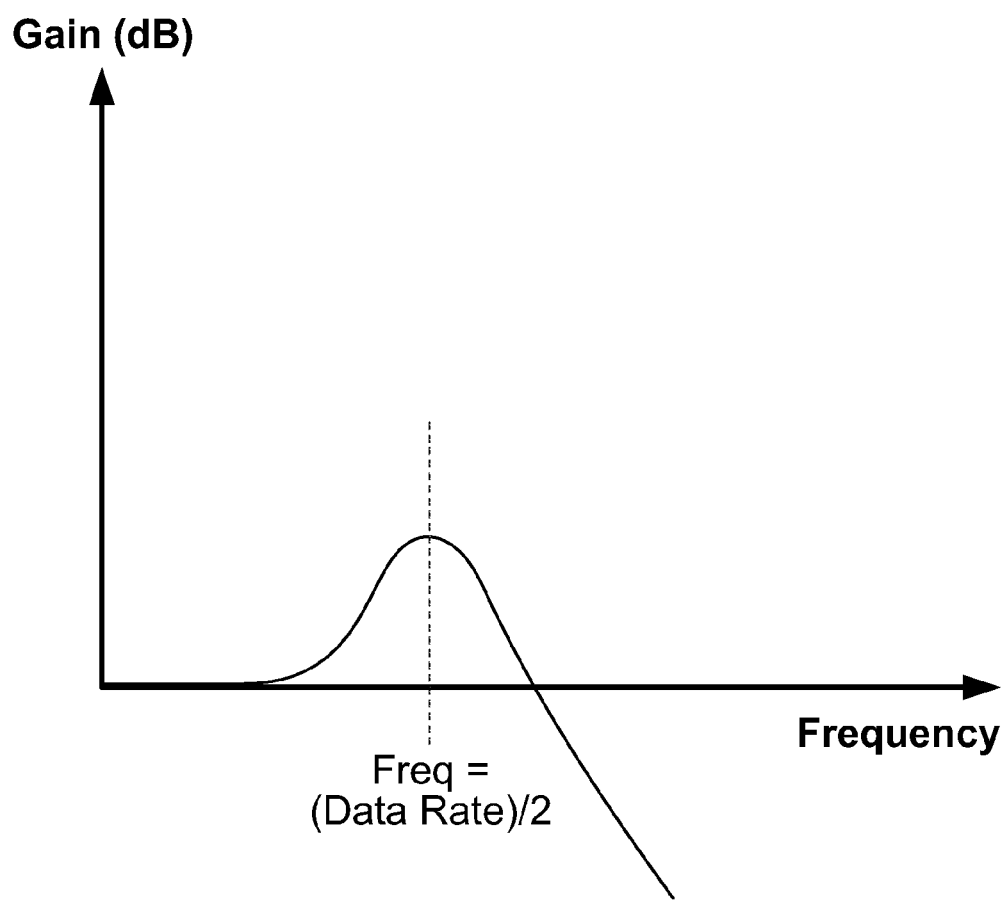
FIG. 1 is a simplified diagram of an equalizer frequency response curve (gain vs. frequency) that is useful in explaining certain principles of the invention.

In a particular illustrative embodiment, the equalizer may need to support up to a 12.5 Gbps data rate, which translates to a 6.25 GHz peaking frequency in FIG. 1 and a 0-dB frequency of approximately 18 GHz. (This last attribute is desirable to enable the equalizer to pass through up to about the third harmonic of the 6.25 GHz frequency of primary interest.) Bandwidth extension techniques need to be employed to achieve this.

In the illustrative embodiment being discussed, the equalizer needs to support data rates from as low as 3.125 Gbps up to 12.5 Gbps. This is too wide to have one fixed design that is tuned for high data rates and reused for the lower end without undesirably amplifying high-frequency noise in the latter case. Also, as has already been mentioned, some protocols have a requirement for a DC coupled mode with very low input common mode voltages (e.g., 0.2V). It has been found possible to meet this requirement by inclusion (in at least some embodiments in accordance with the invention) of a PMOS input stage for the equalizer design. However, such an input stage may not be desirable at higher data rates due to the inherent slow speed of PMOS devices. The present equalizer design therefore provides a way of supporting both low and high input common mode voltages. (An example of a high common mode voltage is 0.7V.)

To achieve a bandwidth extension (e.g., up to 6.25 GHz), equalizer circuitry in accordance with this invention employs several stages (i.e., serially connected instances) of NMOS equalizer circuitry. Each of these NMOS equalizer stages may include a folded, active, inductor structure 10, e.g., of the type shown in FIG. 2. In the particular illustrative embodiment shown in FIG. 2, each equalizer stage 10 is a differential circuit structure that is connected between a source of power supply voltage VDD and ground. Equalizer stage 10 includes two parallel circuit legs, each of which includes (connected in series in the order mentioned) a controllably variable resistor 12a or 12b (RL1 or RL2), the source and drain terminals of an NMOS transistor 14a or 14b, and a controllably variable tail current source 16a or 16b (I1 or I2). The differential signal to be equalized (or further equalized) is applied in complementary form (VIP and VIN) to the gates of transistors 14a and 14b. A controllably variable resistor 20 (or RS) is connected between (1) a node between elements 14a and 16a, and (2) a node between elements 14b and 16b. A controllably variable capacitor 22 (or CS) is connected in parallel with resistor 20 between the above-mentioned two nodes.

Figure 2:
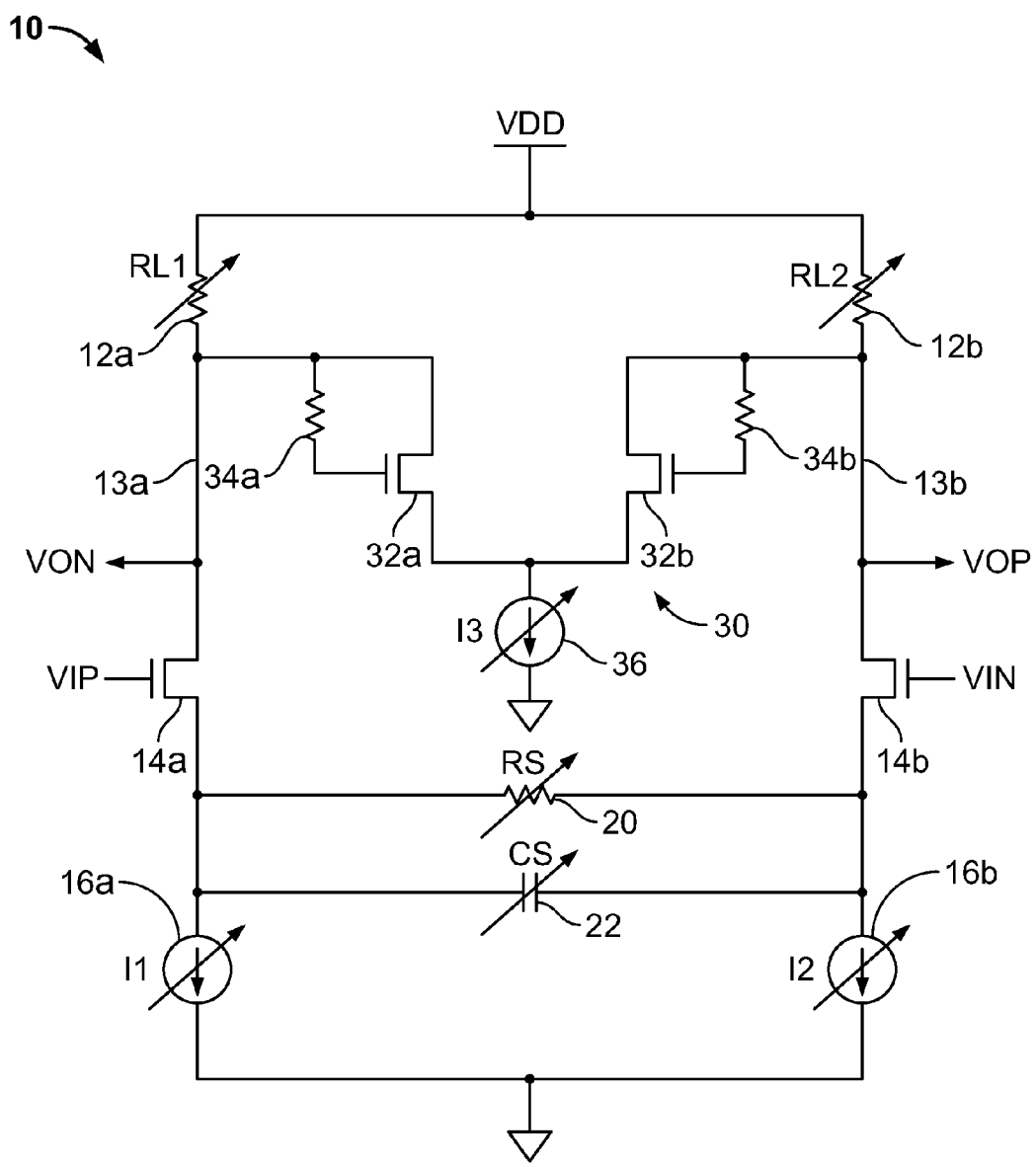
FIG. 2 is a simplified schematic block diagram of an illustrative embodiment of circuitry in accordance with certain possible aspects of the invention.

Continuing on with the particular illustrative embodiment shown in FIG. 2, a differential, folded, active, inductor structure 30 is connected between (1) a node 13a between elements 12a and 14a, and (2) a node 13b between elements 12b and 14b. Structure 30 includes an NMOS transistor 32a having its source-drain path connected in series between node 13a and controllably variable current source 36 (or I3), the other side of which leads to ground. Resistor 34a is connected between node 13a and the gate of transistor 32a. Structure 30 further includes another NMOS transistor 32b having its source-drain path connected in series between node 13b and the same side of current source 36 as transistor 32a. Resistor 34b is connected between node 13b and the gate of transistor 32b. Although structure 30 does not include any actual inductor circuit element, each side of that structure has an impedance vs. frequency response that is similar to that of an inductor. This structure therefore helps to tune out some of the loading capacitance and hence increase the bandwidth of equalizer stage 10. (The loading capacitance thus referred to may include parasitic capacitance, transistor gate capacitance, routing capacitance (e.g., between equalizer stages 10), etc.)

In accordance with certain possible aspects of this invention, tail current sources I1 and I2 are controlled (e.g., by programmable/selectable means) so that the equalizer block power consumption can be reduced when going (for example) from a 12.5 Gbps data rate down to a 6.25 Gbps or a 3.125 Gbps data rate. This can be accomplished by reducing currents I1 and I2, increasing resistances RL1 and RL2, and possibly also reducing VDD. Current I3 may be similarly reduced. (See FIG. 5.) These circuit parameter selections (i.e., reduced currents I1-I3, increased resistances RL1 and RL2, and reduced power supply voltage) reduce the bandwidth of the equalizer circuitry. Capacitor 22 is controllably adjusted to further refine the desired frequency of operation of each equalizer stage 10. FIG. 5 shows that resistor 20 is typically controlled similarly to resistors 12a and 12b.

Figure 3:
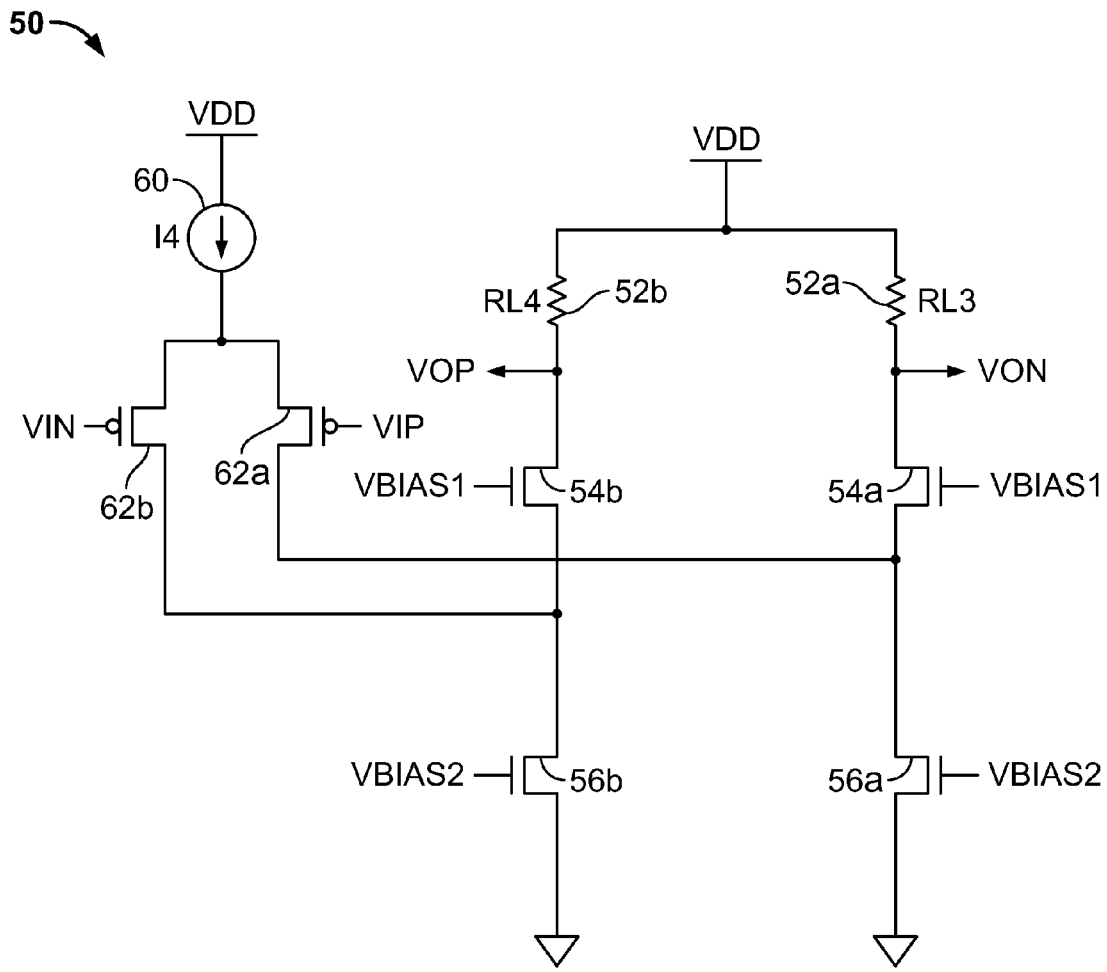
FIG. 3 is a simplified schematic block diagram of an illustrative embodiment of other circuitry in accordance with certain possible aspects of the invention.

To support low input common mode voltages, an optionally usable PMOS input stage equalizer 50 (e.g., as shown in FIG. 3) may be provided as a selectable alternative to a first NMOS stage 10 (e.g., of the type shown in FIG. 2). PMOS stage 50 may be a folded cascode amplifier structure which moves the common mode voltage of the output high enough so that the next stage of the equalizer can be an NMOS stage 10. As will be discussed in more detail in the later description of FIG. 4, only one of the alternatively selectable first stages (i.e., either the first NMOS stage 10 or the PMOS stage 50) is active at any given time. The unselected and therefore inactive first stage is preferably powered down.

As shown in FIG. 3, PMOS stage 50 may be a differential circuit including two legs that are connected in parallel with one another between power supply voltage VDD and ground. Each leg includes (connected in series in the order mentioned) a resistor 52a or 52b (RL3 or RL4), the source-drain path of an NMOS transistor 54a or 54b, and the source-drain path of another NMOS transistor 56a or 56b. PMOS stage 50 also includes a current source 60 connected between VDD and one end of the source-drain path of each of PMOS transistors 62a and 62b. The other end of the source-drain path of PMOS transistor 62a is connected to a node between transistors 54a and 56a. The other end of the source-drain path of PMOS transistor 62b is connected to a node between transistors 54b and 56b. The differential signal to be equalized (VIN/VIP) is applied in complementary form to the gates of transistors 62a and 62b. A first bias voltage VBIAS1 is applied to the gates of transistors 54a and 54b. A second bias voltage VBIAS2 is applied to the gates of transistors 56a and 56b. The equalized, differential, output signal VOP/VON of circuitry 50 is provided at the nodes between resistors 52 and transistors 54. Again, the purpose of folded amplifier structure 50 (if provided and when used) is to shift low input voltage of VIN and VIP to higher output voltage of VOP and VON.

Figure 4:
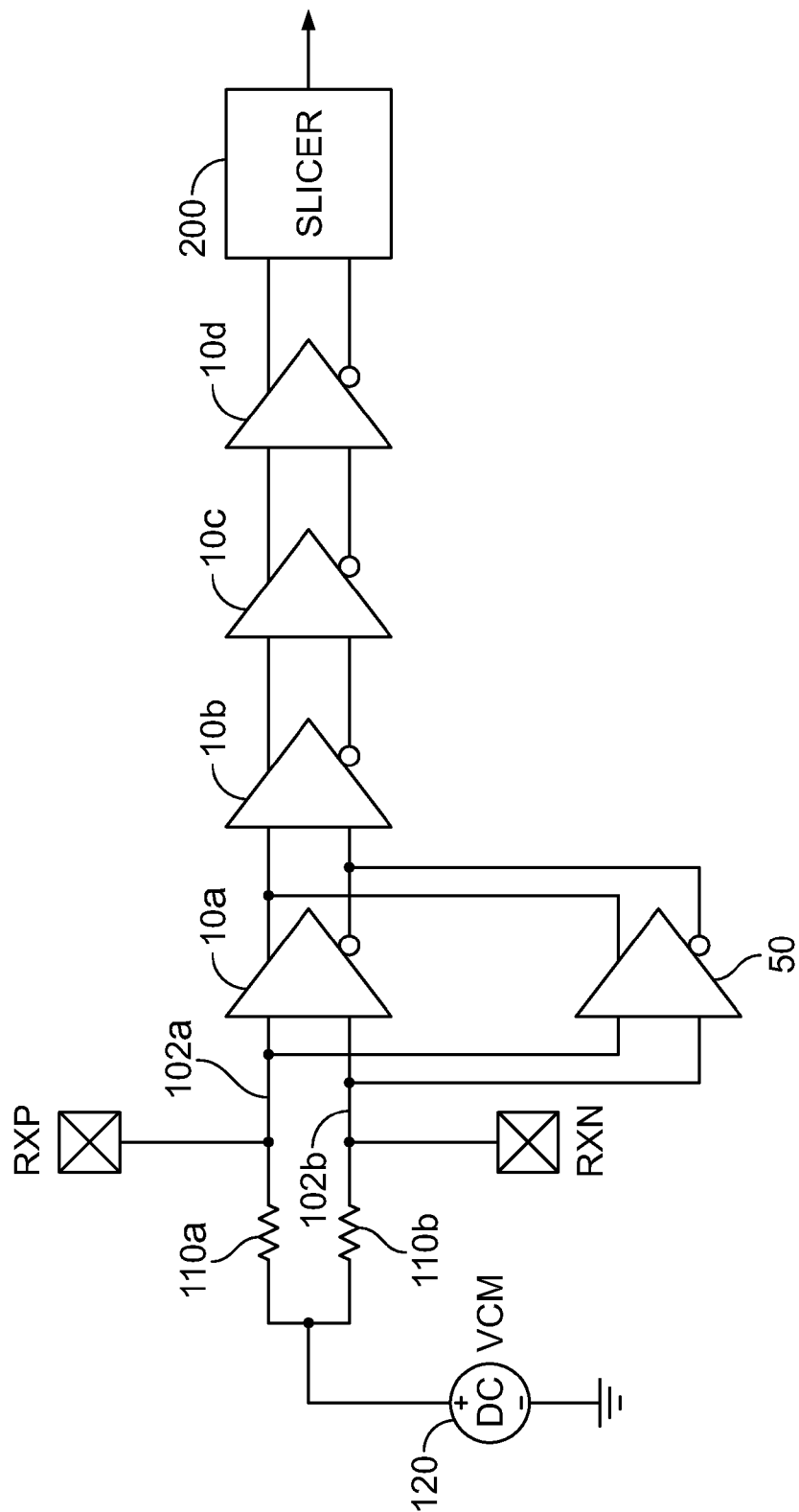
FIG. 4 is a simplified schematic block diagram of an illustrative embodiment of more extensive circuitry in accordance with certain possible aspects of the invention.

FIG. 4 shows an illustrative embodiment of a complete equalizer structure 100 in accordance with certain possible aspects of the invention. The differential signal RXP/RXN to be equalized is applied in complementary form to nodes 102a and 102b. Termination resistors 110a and 110b are connected in series between those two nodes. A source 120 of common mode voltage VCM is connected to a node between resistors 110.

Nodes 102a and 102b are the differential inputs to first stage NMOS equalizer circuitry 10a (e.g., a first instance of circuitry like that shown in FIG. 2). Nodes 102a and 102b are also the differential inputs to optionally provided, first stage PMOS equalizer circuitry 50 (e.g., as shown in FIG. 3). As noted earlier, for communication using any given protocol (and assuming that PMOS stage 50 is provided), only one of first stages 10a and 50 is active, while the other of those stages is powered down.

The differential outputs of both first stage 10a and 50 are the differential inputs to second stage NMOS circuitry 10b (e.g., a second instance of circuitry like that shown in FIG. 2). The differential outputs of second stage 10b are the differential inputs to third stage NMOS circuitry 10c (e.g., a third instance of circuitry like that shown in FIG. 2). The differential outputs of third stage 10c are the differential inputs to fourth stage NMOS circuitry 10d (e.g., a fourth instance of circuitry like that shown in FIG. 2). The differential outputs of fourth stage 10d are the final outputs of equalizer 100. These signals may be applied to whatever utilization circuitry the equalizer is providing input signal pre-processing for. For example, this utilization circuitry may be clock and data recovery ("CDR") circuitry, the first component of which is phase detector or slicer circuitry 200 as shown illustratively in FIG. 4.

FIG. 5 shows an example of how the controllably variable elements in each instance of circuitry 10 in equalizer 100 may be controlled for purposes of enabling the equalizer to provide equalization at various nominal data rates. (In FIG. 5 each of letters D, E, F, and G represents a respective, arbitrary, parameter value that has been generalized to a reference letter to facilitate the discussion.) For example, FIG. 5 shows that for data rates at or approaching 12.5 Gbps, currents I1 and I2 may have a value of D, resistors RL1 and RL2 may have a value of E, resistor RS may have a value of F, and current I3 may have a value of G. On the other hand, for lower data rates like 3.125 or 6.25 Gbps, currents I1 and I2 may be reduced to about 0.5D (i.e., one-half the value D), resistances RL1 and RL2 may be increased to about 2.0E (i.e., two times the value E), resistance RS may be increased to about 2.0F, and current I3 may be reduced to about 0.5G. In all cases the capacitance CS in each equalizer stage 10 is controllably variable to "tune" the frequency responses of the individual stages so that equalizer 100 has the desired overall frequency response. The particular amounts of parameter value increase or decrease shown in FIG. 5 are only illustrative, and other amounts of increase or decrease can be used instead in other embodiments of the invention. This also applies to how much the operating frequency (range) of the equalizer changes (e.g., in case the parameter values 12.5 Gbps, 3.125 Gbps, 6.25 Gbps, etc., change in other embodiments of the invention).

FIG. 6 shows an illustrative embodiment of a type of circuitry that may be used to control the operating parameter value of any of the controllably variable circuit elements used in accordance with the invention. For example, any of the parameters included in FIG. 5 may be controllably varied in this way. FIG. 6 shows the provision of one or more memory cells or registers 300 (e.g., on the IC that includes equalizer circuitry like that shown in FIG. 4) being used to control the operating parameter value (e.g., resistance, current, capacitance, etc.) of the controllably variable circuit element controlled by that circuitry 300. For example, if the equalizer circuitry is included in a programmable or configurable IC like a programmable logic device ("PLD"), field programmable gate array ("FPGA"), programmable microcontroller, or the like, circuitry 300 may be configuration random access memory ("CRAM") circuitry of the IC. A typical use of such CRAM is to program or configure (or reprogram or reconfigure) the IC prior to switching the IC over to "normal" or "user mode" operation of the IC. Such programming or configuring converts the as-manufactured, general-purpose IC to a device that is adapted to perform in the particular ways desired by particular users. Thus, with particular reference to circuitry 300, a user can program that circuitry with particular binary configuration data values so that equalizer 100 will be thereby controlled to perform appropriately for a particular data rate and other specific attributes (e.g., common mode voltage) of a particular communication protocol that the user desires to implement. For example, some one or more of CRAM elements 300 may be programmed to control the resistance(s) of resistors 12a and 12b (either individually (and therefore to possibly different values) or jointly (and therefore to one common value)). Some others of CRAM elements 300 may be programmed to control the magnitude(s) of tail currents I1 and I2 (elements 16a and 16b) (again, either individually or jointly). Still others of CRAM elements 300 may be programmed to control other elements identified in FIG. 6.

FIG. 7 shows an illustrative embodiment of a type of circuitry that may be used to select which one of first stages 10a and 50 in FIG. 4 will be used in a particular application of an IC that includes equalizer circuitry 100 (assuming that alternative first stage 50 has been provided). For example, FIG. 7 shows circuitry 400 (which can be like above-described circuitry 300 in FIG. 6) controlling whether the power for stage 10a or 50 is on or off. If circuitry 400 turns on the power for stage 10a, then it also turns off the power for stage 50. Alternatively, if circuitry 400 turns on the power for stage 50, then it also turns off the power for stage 10a. Again, as in the case of circuitry 300, the user can program circuitry 400 to make this selection as to which one of first stages 10a and 50 will be used (powered), while the other of those stages is powered down.

It will be understood that the foregoing is only illustrative of the principles of the invention, and that various modifications can be made by those skilled in the art without departing from the scope and spirit of the invention.

What is claimed is:

1. Equalizer circuitry on an integrated circuit ("IC") comprising:
    a plurality of NMOS equalizer stages connected in series;
    a PMOS equalizer stage connected in parallel with the NMOS equalizer stage that is first in the series; and
    control circuitry for determining whether the PMOS equalizer stage or the NMOS equalizer stage that is first in the series will be used.

2. The equalizer circuitry defined in claim 1 wherein the control circuitry controls whether or not each of the PMOS equalizer stage and the NMOS equalizer stage that is first in the series receives electrical power required for operation of that stage.

3. The equalizer circuitry defined in claim 1 wherein each of the NMOS equalizer stages and the PMOS equalizer stage comprise differential circuitry.

4. The equalizer circuitry defined in claim 1 wherein the plurality comprises four NMOS equalizer stages.

5. The equalizer circuitry defined in claim 1 wherein an output signal of the NMOS equalizer stage that is last in the series is connected to clock and data recovery ("CDR") circuitry on the IC.

6. The equalizer circuitry defined in claim 1 wherein the control circuitry comprises memory circuitry on the IC.

7. The equalizer circuitry defined in claim 6 wherein the memory circuitry is programmable.

8. The equalizer circuitry defined in claim 1 wherein at least one of the NMOS equalizer stages comprises:
    controllably variable capacitor circuitry; and
    folded active inductor circuitry.

9. The equalizer circuitry defined in claim 8 wherein the at least one of the NMOS equalizer stages further comprises:
an NMOS transistor having a source-drain path connected in series between the folded active inductor circuitry and the controllably variable capacitor circuitry in the at least one of the NMOS equalizer stages, wherein a signal to be equalized by the at least one of the NMOS equalizer stages is applied to a gate of the NMOS transistor, and wherein an equalized output signal is derived from a node on the source-drain path of the NMOS transistor.

10. The equalizer circuitry defined in claim 9 wherein the at least one of the NMOS equalizer stages further comprises:
a source of power supply voltage;
a controllably variable resistor connected in series between the source of power supply voltage and a first end of the source-drain path of the NMOS transistor;
a source of ground voltage; and
a controllably variable current source connected in series between a second end of the source-drain path of the NMOS transistor and the source of ground voltage.

11. The equalizer circuitry defined in claim 10 wherein the at least one of the NMOS equalizer stages further comprises:
a further controllably variable resistor connected in parallel with the controllably variable capacitor circuitry; and
a further controllably variable current source in the folded active inductor circuitry of the at least one of the NMOS equalizer stages.

12. The equalizer circuitry defined in claim 11 further comprising:
memory circuitry on the IC for controlling at least one of the controllably variable capacitor, the controllably variable resistor, the controllably variable current source, the further controllably variable resistor, and the further controllably variable current source.

13. The equalizer circuitry defined in claim 12 wherein the memory circuitry is programmable.

14. Equalizer circuitry on an integrated circuit ("IC") comprising:
a plurality of NMOS equalizer stages connected in series, wherein each of the NMOS equalizer stages is programmable to control at least one of bandwidth and power consumption of the equalizer circuitry, and wherein each of the equalizer stages comprises folded active inductor circuitry.

15. The equalizer circuitry defined in claim 14 wherein each NMOS equalizer stage comprises a controllably variable current source.

16. The equalizer circuitry defined in claim 14 wherein each equalizer stage comprises:
first and second circuit legs connected in parallel with one another between a power supply voltage source and ground; and wherein the folded active inductor circuitry is connected between the circuit legs.

17. The equalizer circuitry defined in claim 14 further comprising:
a PMOS equalizer stage connected in parallel with the NMOS equalizer stage that is first in the series; and
control circuitry for determining whether the PMOS equalizer stage or the NMOS equalizer stage that is first in the series will be used, wherein each of the NMOS equalizer stages comprises:
first and second circuit legs connected in parallel with one another between a power supply voltage source and ground, each of the circuit legs including a source-drain path of an NMOS transistor, a controllably variable resistor connected in series between the power supply voltage source and a first end of the source-drain path, and a controllably variable current source connected in series between a second end of the source-drain path and ground;
a controllably variable capacitor connected between the circuit legs; and
a further controllably variable resistor connected between the circuit legs.

18. The equalizer circuitry defined in claim 17 wherein the PMOS equalizer stage comprises differential circuitry.

19. The equalizer circuitry defined in claim 17 further comprising:
memory circuitry on the IC for controlling at least one of the control circuitry, the controllably variable resistors, the controllably variable current sources, the controllably variable capacitors, and the further controllably variable resistors.

20. The equalizer circuitry defined in claim 19 wherein the memory circuitry is programmable.

21. The equalizer circuitry defined in claim 17 wherein each of the NMOS equalizer stages further comprises:
folded active inductive circuitry connected between first and second nodes that are respectively in the first and second circuit legs between the controllably variable resistor and the source-drain path in the respective circuit legs.

22. The equalizer circuitry defined in claim 21 wherein, in each of the NMOS equalizer stages, the controllably variable capacitor and the further controllably variable resistor are connected in parallel with one another between third and fourth nodes that are respectively in the first and second circuit legs between the source-drain path and the controllably variable current source in the respective circuit leg.

23. The equalizer circuitry defined in claim 22 wherein, in each of the NMOS equalizer stages, a signal to be equalized by that stage is applied in complementary form to gates of the NMOS transistors in that stage, and a signal that has been equalized by that stage is output in complementary form from the first and second nodes.

24. Equalizer circuitry on an integrated circuit ("IC") comprising:
a plurality of differential NMOS equalizer stages connected in series, each of the NMOS equalizer stages being programmable to control one of bandwidth and power consumption of the equalizer circuitry;
a differential PMOS equalizer stage connected in parallel with the NMOS equalizer stage that is first in the series; and
control circuitry for determining whether the PMOS equalizer stage or the NMOS equalizer stage that is first in the series will be used.

* * * * *